United States Patent [19]

Kitani

[11] Patent Number: 4,778,546

[45] Date of Patent: Oct. 18, 1988

[54] SCREEN FABRIC AND METHOD OF MAKING SAME

[75] Inventor: Yozo Kitani, Tokyo, Japan

[73] Assignee: NBC Industries Co., Ltd., Tokyo, Japan

[21] Appl. No.: 907,668

[22] Filed: Sep. 15, 1986

[51] Int. Cl.$^4$ .................. D06C 13/00; D06H 7/22
[52] U.S. Cl. .................... 156/73.3; 139/302; 156/88; 156/257; 156/267; 156/353; 156/515; 156/580.1; 156/580.2
[58] Field of Search .............. 139/302; 428/193; 156/73.3, 88, 251, 267, 353, 515, 580.1, 580.2

[56] References Cited

U.S. PATENT DOCUMENTS

| | | | |
|---|---|---|---|
| 4,227,959 | 10/1980 | Brown | 156/73.3 |
| 4,496,407 | 1/1985 | Lowrey et al. | 156/73.3 |
| 4,501,782 | 2/1985 | Weatherly et al. | 156/73.2 |
| 4,534,819 | 8/1985 | Payet et al. | 580/2 |

*Primary Examiner*—James C. Cannon
*Attorney, Agent, or Firm*—Frishauf, Holtz, Goodman & Woodward

[57] ABSTRACT

A screen fabric employed in screen printing is improved by flattening its selvages to the extent of the thickness of the ground of the screen fabric so that wrinkles having been occurred in the selvages of the wound-up fabric are removed to increase the yield of stencils obtained from the screen fabric. In addition, the thus flattened selvages make it possible to apply a sufficiently large tensile force to the screen fabric in its stretching operation in order to produce a highly precise stencil for conducting a precise screen printing of the circuitboard and the like.

1 Claim, 6 Drawing Sheets

SCREEN FABRIC AND METHOD OF MAKING SAME

BACKGROUND OF THE INVENTION

1. Field of the Invention

The present invention relates to a screen fabric and a method for making the same, which are employed in preparation of a precise stencil for screen printing of circuit-board and the like.

2. Description of the Prior Art

The screen fabric is stretched at a temperature of 100° to 220° C. to be stabilized in size and shape, which is termed "heat setting". In this heat setting process, the screen fabric is catched by its selvages or opposite end portions in warp direction by tenters of a tentering machine and stretched by the sames. In this heat setting process, the selvages of the screen fabric are held by means of pins or clips so that faults such as pinholes and collapses are produced in the screen fabric.

As shown in FIGS. 8 and 11, in conventional screen fabrics, selvages 3a, 3b have thicknesses of about 1.5 times larger than grounds 2a, 2b, which selvages 3a, 3b have normally widths of 10 to 15 mm and extend in warp direction of the screen fabrics 1a, 1b as indicated by an arrow "A" so as to be shaped into strip-like forms, opposite edges 4a, 4b of which selvages 3a, 3b have thicknesses of more than two times larger than the grounds 2a, 2b. As shown in a first conventional example in FIG. 8, the screen fabric is woven mainly of synthetic fibers of 7 to 50 denier. Consequently, although the selvages 3a, 3b are thicker than the grounds 2a, 2b, since the thickness of the selvage 3a is in a very thin order of 140 μm, the screen fabric is apt to be torn in its portions where faults 3a' such as pinholes and collapses are present, when stretched.

In order to prevent the screen fabric from being torn in its stretching operation, as shown in a second conventional example in FIG. 11 in which the reference numeral 3b' denotes a pinhole, there has been proposed the selvage 3b provided with its stepped reinforcing portion called "selvage weave". However, such provision of the selvage weave is not sufficient in reinforcing the selvage 3b while disadvantageous in applying a sufficient tensile force for the screen fabric in the stretching operation of the same in warp direction as indicated by the arrow "A" because of the selvage weave being resistant to such stretching operation.

FIGS. 10 and 12 show results of the tensile strength test in warp direction of the first and second conventional examples, in which test the first conventional example shows 20.5 Kg on the average while the second conventional example shows 23.5 Kg on the average. In this test, specifications of specimens are as follows:

THE FIRST CONVENTIONAL EXAMPLE
Mesh size (the number of fibers/inch): 250 to 252 warps/248 wefts
Fiber diameters (μm): warp × weft 40
Thickness of the fabric (μm): 63 to 64
Width of the fabric (cm): 116.7

THE SECOND CONVENTIONAL EXAMPLE
Mesh size (the number of fibers/inch): 248 to 251 warps/248 to 249 wefts
Fiber diameters (μm): warp 40 × weft 40
Thickness of the fabric (μm): 63 to 64
Width of the fabric (cm): 115.4

The test is conducted according to a tensile testing of fabrics described in JIS L 1096 (1979) in a manner of a constant rate of extension with the use of a test width of 5 cm, test length of 20 cm and a test speed of 10 cm/minute.

In the conventional apparatus and method, in width setting, the screen fabric is cut in weft direction by the use of heat generated in a nichrome wire so that the molten resin of the fabric under the effect of the heat adheres to the selvage and is solidified into a rigid integral entity which is apt to crack in the stretching operation of the screen fabric, and, as a result, the cracks appearing in such rigid entity often initiate the tears of the screen fabric in its stretching operation.

Due to the above-mentioned reasons, in the conventional screen fabric, it is hard to conduct the stretching operation of the fabric with a sufficient tensile force (refer to comparative samples described later), to make it difficult to produce a highly precise product such as a precise stencil for screen printing of circuit-board and the like. When a stencil having an insufficient tensile force is employed in the screen printing, the stencil is largely elongated in its transferring operation to decrease a parting force of the stencil with regard to a necessary printing pressure thereof, so that the quality of such screen printing is made poor.

In addition, in the conventional screen fabric, as described in the above, the selvages 3a, 3b have thicknesses of about 1.5 times larger than the grounds 2a, 2b and are shaped into the strip-like forms having widths of 10 to 15 mm, opposite edges 4a, 4b of which selvages 3a, 3b have thicknesses of more than two times larger than the grounds 2a, 2b, so that the difference between the grounds 2a, 2b and the selvages 3a, 3b in thickness is emphasized when the screen fabric is wound up, whereby wrinkles 1c are produced in the grounds 2a, 2b to deteriorate the screen fabric in its appearance. In case that such wrinkles 1c are too strong, it is not possible to employ such wrinkled screen fabric as stencil for the screen printing. (refer to FIG. 13).

SUMMARY OF THE INVENTION

It is an object of the present invention to resolve the above defects, i.e., 1. to prevent the screen fabric from being torn in weft direction under the effect of a tensile force acting on the screen fabric in warp direction in the stretching operation of the fabric;
2. to make it possible to apply a sufficiently large tensile force to the screen fabric in its stretching operation to provide a highly precise stencil for the screen printing of the circuit-board and the like;
3. to apply a sufficiently large tensile force to the screen fabric so as to make it possible to provide a stencil having little elongation to increase the quality of the screen printing employing such stencil; and
4. to prevent the wrinkles from occurring in the screen fabric when the fabric is wound up, to make it possible to obtain a stencil from the screen fabric and to improve the stencil in its appearance.

In order to accomplish the above objects, the present invention provides: in an elongated screen fabric comprising a ground and selvages, the improvement wherein the selvages have the substantially same thickness as that of the ground, opposite edges of which selvages are shaped into line-like forms having the thicknesses of up to two times larger than the ground.

Further, the present invention provides: the above screen fabric, wherein the opposite edges of the selvages have the thicknesses of about 1.5 times larger than the ground.

Further, the present invention provides: in a process for producing an elongated screen fabric comprising a ground and selvages, the improvement wherein a material fabric having a width wider than a predetermined width by its wide-width forming portions are catched by the sames by means of tenters to be subjected to a heat setting operation; then, the wide-width forming portions are cut off by a cutting blade under the effect of ultrasonic, the cutting blade being cooled in the cutting-off operation.

Further, the present invention provides the above process for producing the screen fabric, wherein the frequency of the ultrasonic is 28 KHz.

Further, the present invention provides the above process for producing the screen fabric, wherein the cutting blade is cooled to a temperature of 0° to 40° C. in the cutting-off operation.

DESCRIPTION OF THE PREFERRED EMBODIMENT

A screen fabric of the present invention will be hereinbelow described with reference to the drawings.

Figure 1:
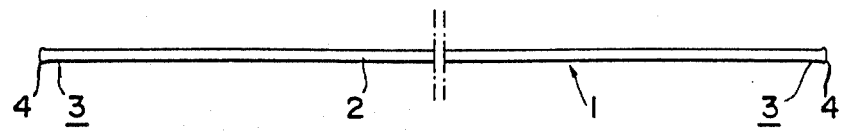
FIG. 1 is a front view of an embodiment of the screen fabric of the present invention.
Figure 2:
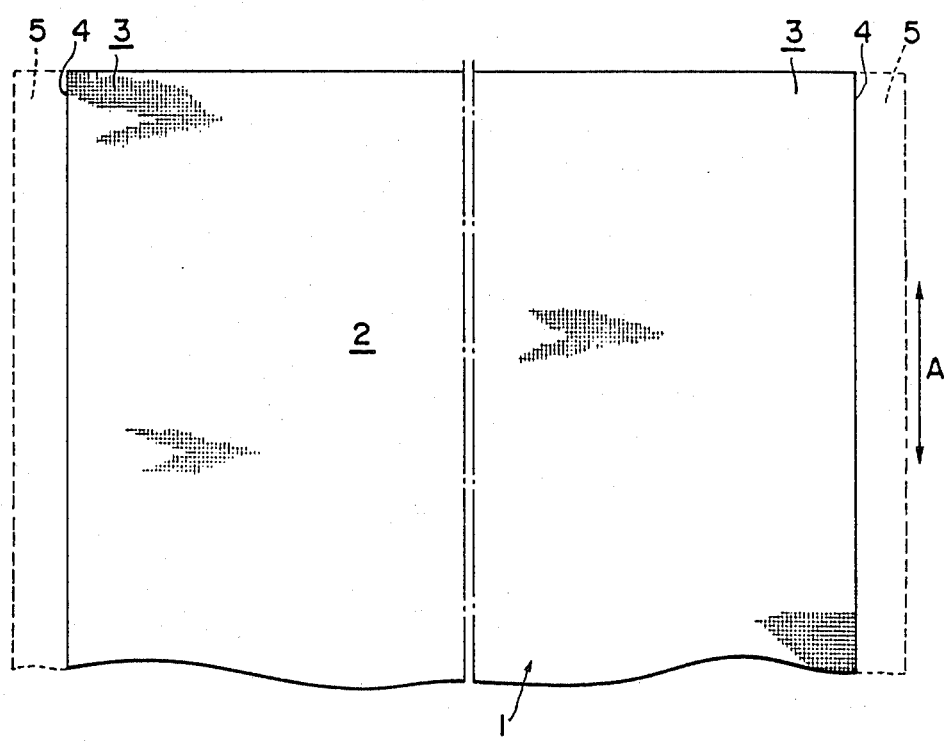
FIG. 2 is a plan view of the embodiment shown in FIG. 1.

In FIGS. 1 and 2, a screen fabric 1 comprises an elongated fabric woven of synthetic fibers of 7 to 50 denier, and is constructed of a ground 2 and selvages 3. The ground 2 has a thickness of 62 to 64 $\mu$m and a predetermined width, for example, a width of more than 115 cm for a stencil having a width of 115 cm. The selvage 3 has the same thickness as that of the ground 2. Opposite edges 4 of the selvages 3 are shaped into line-like forms having widths of up to 0.3 mm and thicknesses of up to two times larger than the ground 2. In winding operation shown in FIG. 14, the screen fabric is wound up around a winding unit 10 which is slightly swung in a lateral direction by an amount of about 1 mm, to make it possible to prevent wrinkles from occurring in the ground 2, provided that the selvages have the widths and thicknesses thereof within the above-mentioned ranges, because it is possible to prevent the difference in diameter between the ground 2 and the selvages 3 of the wound-up screen fabric from excessively increasing when the screen fabric is swung in a lateral direction by an amount of 0.6 mm. In the embodiment of the screen fabric of the present invention, the opposite edges 4 of the selvages 3 have widths of about 0.16 mm and thicknesses of about 1.5 times larger than the ground 2, i.e., thicknesses of 96 $\mu$m. In this embodiment of the screen fabric of the present invention, polyester monofilaments are employed as the synthetic fibers and woven into a fabric having a 250 mesh.

Figure 4:
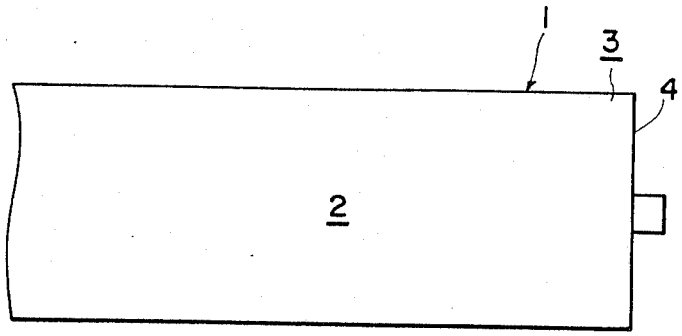
FIG. 4 is a front view of the screen fabric having been wound, which fabric is the embodiment shown in FIG. 1.
Figure 14:
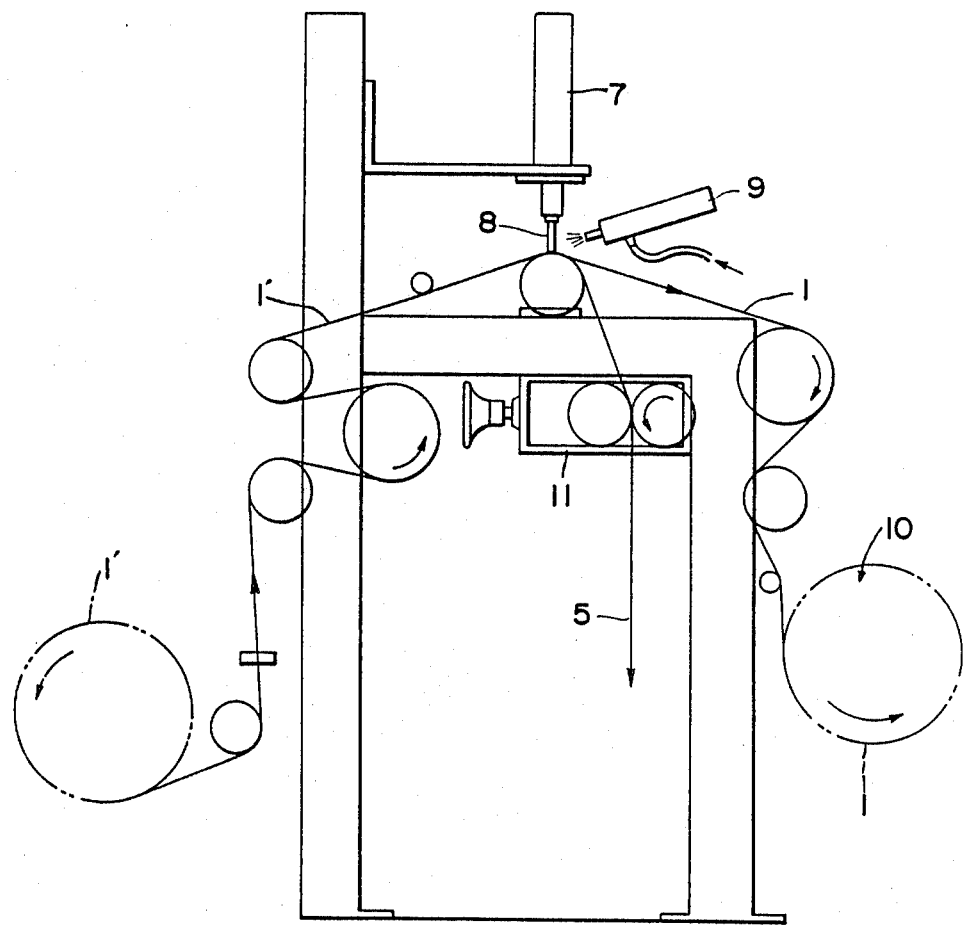
FIG. 14 is an outline of an embodiment of a method for making the screen fabric of the present invention.

FIG. 14 shows a method of making such screen fabric of the present invention, in which: first, a material 1' for the screen fabric is formed into a fabric having a width larger than a predetermined width by an amount of about 15 to 20 mm at each edge of the fabric; the thus formed material fabric 1' is catched by its wide-width forming portions 5 formed in opposite edge portions in warp directions as indicated by an arrow "A" by means of tenters (not shown) to be heated at a temperature of 100° to 200° C. in its expanded condition so as to be subjected to a heat setting operation; the material fabric 1' thus subjected to the heat setting operation is cut in its portions inside the portions catched by the tenters in warp direction by the use of ultrasonics so that the wide-width forming portions 5 in which faults such as pinholes and collapses produced by the tenters are removed. In the method of the present invention, though the frequency of an ultrasonic vibrator 7 is not limited, it is found that a frequency of 28 KHz is preferable in operability and quality of the products, i.e., stencils. In the above cutting operation, a cutting blade 8 is kept in its temperature within a range of 0° to 40° C. by the use of a cooling unit 9, because it is often impossible to conduct such cutting operation when the cutting blade 8 is cooled in a temperature of less than 0° C., while, in case that the cutting blade 8 is heated in a temperature of over 40° C. the screen fabric is melted under the effect of frictional heat generated in the cutting operation and solidified to form partially rigid integral entities in the screen fabric, which entities weaken the screen fabric and deteriorate the appearance of the same due to the scorched appearance of the entities caused by over-heating. It is empirically found that a temperature of about 35° C. is preferable for the cutting blade 8 to smoothly conduct the cutting operation of the screen fabric. The material fabric 1' in which the wide-width forming portions 5 have been cut off as described in the above forms a screen fabric 1 which is wound up around the winding unit 10, while the thus cut-off wide-width forming portions 5 are pulled by a pulling unit 11 and discarded. FIG. 4 shows the screen fabric 1 having been wound up into a roller-like shape.

Figure 5:
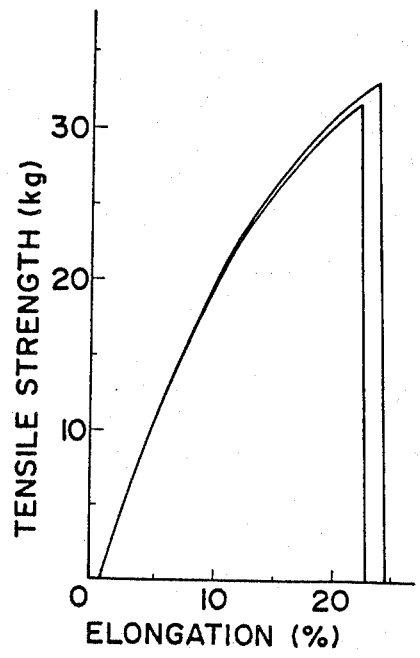
FIG. 5 is a graph showing the results of the tensile strength test of the selvage of the screen fabric in its warp direction, which fabric is shown in FIG. 1.
Figure 10:
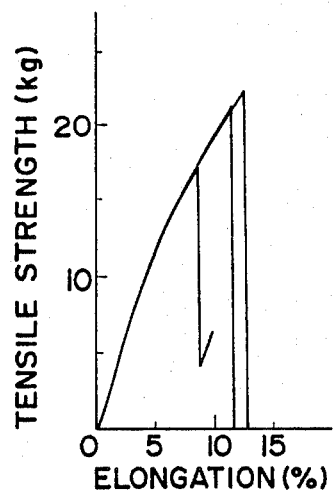
FIG. 10 is a graph showing the results of the tensile strength test of the selvage of the first conventional example in its warp direction.
Figure 12:
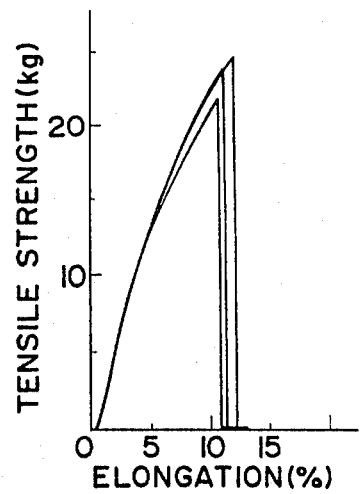
FIG. 12 is a graph showing the result of the tensile strength test of the selvage of the second conventional example of the screen fabric in its warp direction.
Figure 11:
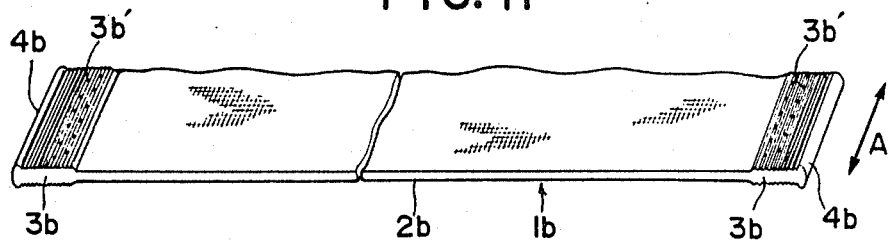
FIG. 11 is a perspective view of the second conventional example of the screen fabric.
Figure 13:
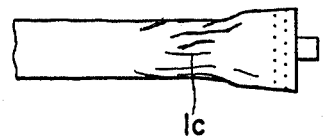
FIG. 13 is a front view of the conventional screen fabric in its wound-up condition.

In the screen fabric 1 of the present invention, since the wide-width forming portions 5 in which the faults such as the pinholes and collapses produced by the tenters are removed from the screen fabric 1, it is possible to remarkably increase the tensile strength of the screen fabric 1 in its stretching operation in warp direction so as to prevent the tears from occurring in the screen fabric 1. FIG. 5 is a graph showing the results of a tensile strength test of the screen fabric 1 in warp direction, from which graph it is found that the tensile strength of the selvages 3 of the screen fabric 1 increases to a value of 32.25 Kg in the average which is about 1.5 times larger than the conventional screen fabric, i.e., is larger than the latter by about 10 Kg (refer to FIGS. 10 and 12). In such tensile strength test, specifications of specimens of the screen fabric 1 of the present invention are as follows:

Mesh size (the number of fibers/inch): 250 to 252 warps/248 to 249 wefts

Fiber diameters ($\mu$m): warp 40 × weft 40

Thickness of the fabric ($\mu$m): 63 to 64

Width of the fabric (cm): 116.1

Figure 6:
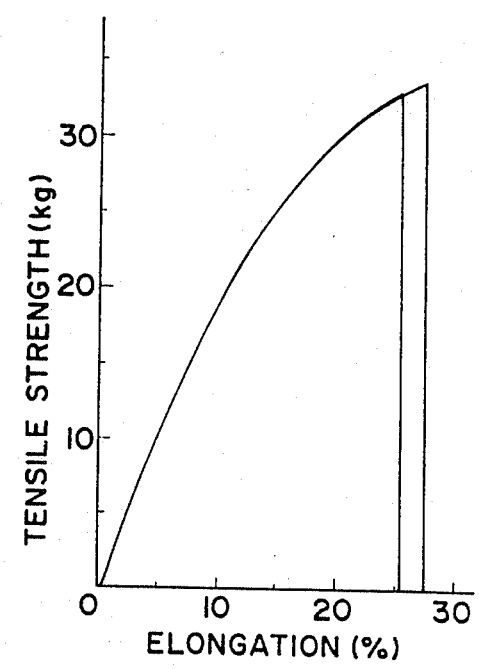
FIG. 6 is a graph showing the results of the tensile strength test of the ground of the screen fabric in its warp direction, which fabric is shown in FIG. 1.

The test is conducted according to a tensile testing of fabrics described in JIS L 1096 (1979in a manner of a constant rate of extension with the use of a test width of 5 cm, test length of 20 cm and a test speed of 10 cm/minute. The tensile strength of 32.25 Kg described above is approximately equal to a tensile strength of the ground 2 shown in FIG. 6 in warp direction which is 33.9 Kg in the average. This proves a remarkable tensile strength of the screen fabric 1 of the present invention. What is stretched and employed as the stencil for screen printing is such ground 2 so that the tensile strength of the ground 2 is an ideal strength of the screen fabric. In contrast with the conventional screen fabric in which the tensile strength of the selvages 3a, 3b are about ⅔ of that of the grounds 2a, 2b, the screen fabric 1 of the present invention can be provided with the selvages having the substantially same tensile strength as that of the ground of the screen fabric 1. The tensile strength test shown in FIG. 6 is conducted in the same manner as that shown in FIG. 5.

Consequently, since there is no fear that the screen fabric 1 is torn in its stretching operation, it is possible to apply a sufficiently large tensile force to the screen fabric 1 of the present invention in its stretching operation. The following is results of tensile testing of the screen fabric 1 of the present invention, the first conventional example of the screen fabric and the second conventional example of the screen fabric, which testing is conducted by the use of a stretching machine in warp direction of the screen fabrics over three times, each of which results is the average of the three determinations:

Tensile force applied to the embodiment of the present invention: 18.2 (N/cm)

Tensile force applied to the first conventional example: 12.3 (N/cm)

Tensile force applied to the second conventional example: 11.7 (N/cm)

Testing conditions:
stretching machine: motor-drive type width of the specimen: 78 cm (the specimen is provided with a selvage at its one edge and torn at its the other edge)

specimen length: 97.4 cm test temperature: 20° to 22° C.

tensionmeter: Tetko Inc. "Mat-W"

Figure 7:
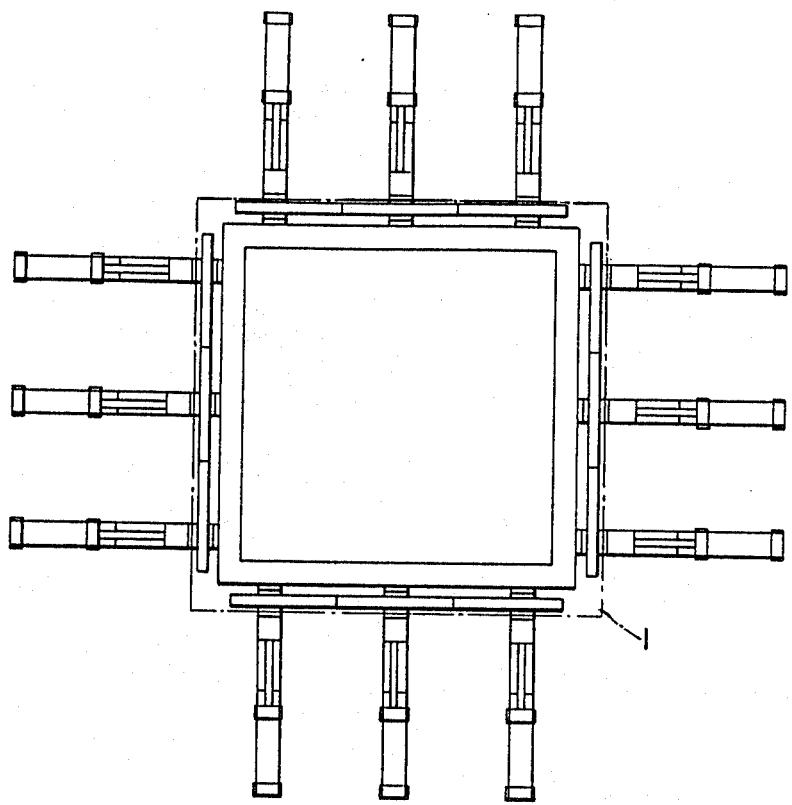
FIG. 7 is a plan view of the screen fabric shown in FIG. 1 in its stretching operation.
Figure 8:
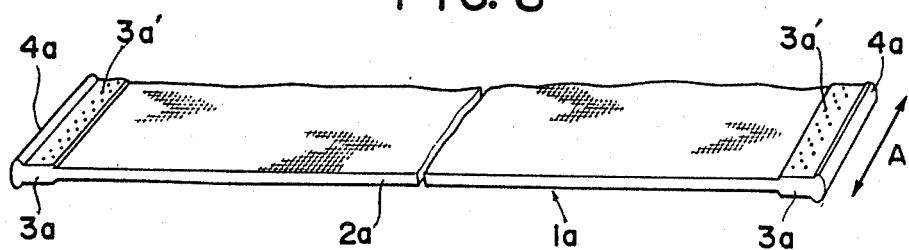
FIG. 8 is a perspective view of the first conventional example of the screen fabric.

In the actual stretching operation, the screen fabric is stretched also in weft direction as well as in warp direction as shown in FIG. 7 so that the tensile force applied to the screen fabric is the sum of the tensile force acting in the weft direction of the fabric and that acting in the warp direction of the same. Consequently, the difference between the tensile forces applicable to the screen fabric of the present invention and the conventional examples is larger than that of the above values. As described in the above, according to the present invention, it is possible to increase the tensile force of the screen fabric in its stretching operation about up to 1.5 times larger than that of the conventional screen fabric, to make it possible to provide a highly precise stencil for the screen printing of the circuit board and the like.

In addition, since it is possible to apply a sufficiently large tensile force to the stencil, such stencil has little elongation in screen printing and realizes an easy parting thereof in ink transferring operation, so that the quality of the screen printing is remarkably improved to make it possible to provide a stencil for the screen printing of the circuit-board and the like which requires a highly precise printing.

Figure 3:
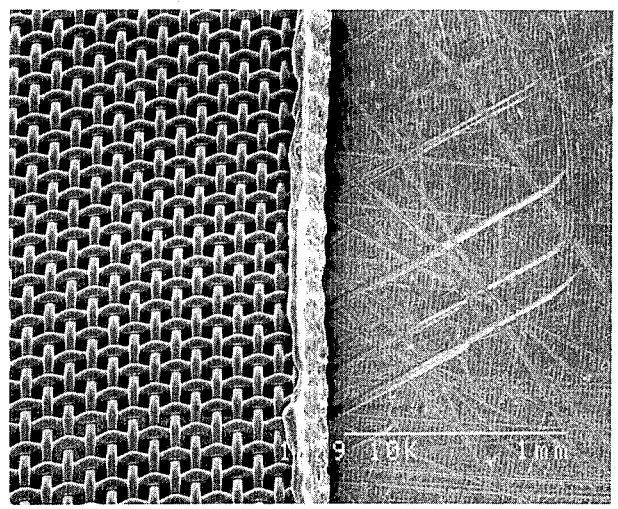
FIG. 3 is a microscopic photograph of the embodiment shown in FIG. 1, showing the form of monofilaments of the selvage of the embodiment shown in FIG. 1.
Figure 9:
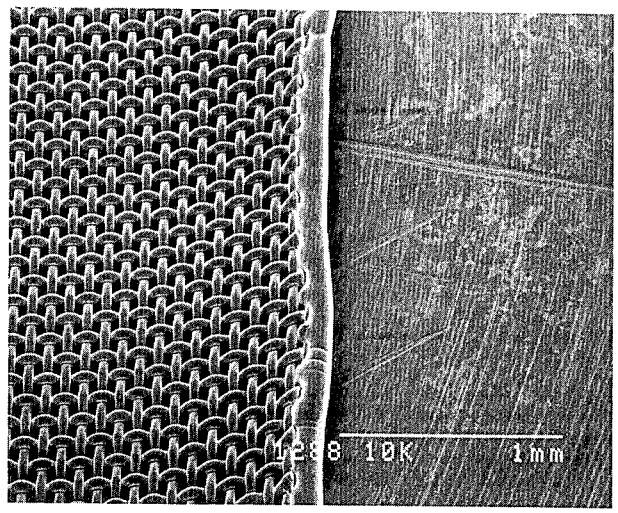
FIG. 9 is a microscopic photograph of a part of the selvage of the first conventional example of the screen fabric.

In addition, in the cutting operation conducted by the use of the ultrasonics, the blade tip of the cutting blade 8 is always cooled to a temperature of 0° to 40° C. by means of the cooling unit 9 so that the heat generated by the vibrational friction is removed while the cutting operation is conducted by the effect of the ultrasonic vibration. As a result, the screen fabric is prevented from being melted and adhering to the selvages 3 of the screen fabric under the effect of the frictional heat, to make it possible to prevent the selvages 3 from having the block-like shapes rigidified with the solidified resin. As shown in the microscopic photograph in FIG. 3, the selvages 3 of the screen fabric of the present invention have flattened shapes but not block-like rigidified shapes of the selvages of the conventional examples shown in the microscopic photograph in FIG. 9. Consequently, in the screen fabric of the present invention, the selvages 3 are not excessively thick in contrast with the cases of the conventional examples in which the selvages have the thicknesses larger than the ground of the screen fabric. And, the selvages 3 of the screen fabric of the present invention are shaped into strip-like forms to make it possible to prevent the wrinkles from occurring in the wound-up screen fabric.

What is claimed is:

1. A process for producing a screen fabric including a ground and selvages, comprising the steps of:
    providing a screen material fabric with wide-edge portions on both sides of a main body having a predetermined width;
    heat setting said screen material fabric as it is being stretched by the wide-edge portions; and
    removing said wide-edge portions with an ultrasonic cutting blade operating at a frequency of 28 KHz.

* * * * *

UNITED STATES PATENT AND TRADEMARK OFFICE
CERTIFICATE OF CORRECTION

PATENT NO. : 4,778,546
DATED      : October 18, 1988
INVENTOR(S): KITANI, Yozo

It is certified that error appears in the above-identified patent and that said Letters Patent is hereby corrected as shown below:

Column 6, after line 63,

The following words: --while cooling the cutting blade to a temperature of $0 - 40°$ C-- after "28 KH$_z$" should be added.

Signed and Sealed this

Second Day of May, 1989

Attest:

DONALD J. QUIGG

Attesting Officer

Commissioner of Patents and Trademarks